(12) United States Patent
Tsai

(10) Patent No.: US 6,735,228 B2
(45) Date of Patent: May 11, 2004

(54) DRIVING CONTROL CIRCUIT FOR LIGHT-EMITTING DEVICE

(75) Inventor: Chia-Ming Tsai, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/227,408

(22) Filed: Aug. 26, 2002

(65) Prior Publication Data
US 2003/0156609 A1 Aug. 21, 2003

(30) Foreign Application Priority Data
Feb. 15, 2002 (TW) .................................. 91102573 A

(51) Int. Cl.⁷ .............................................. H01S 3/00
(52) U.S. Cl. .......................... 372/38.02; 372/38.04; 372/38.07
(58) Field of Search .......................... 372/38.02, 38.04, 372/38.07

(56) References Cited
U.S. PATENT DOCUMENTS 5,563,898 A * 10/1996 Ikeuchi et al. ............ 372/38.07
6,021,143 A * 2/2000 Ransijn et al. ............ 372/38.02
6,130,562 A * 10/2000 Bosch et al. .............. 372/38.02
6,563,849 B2 * 5/2003 Mizuno .................... 372/38.02
6,590,914 B1 * 7/2003 Tanase et al. ............. 372/38.02
6,597,209 B2 * 7/2003 Iguchi et al. .............. 372/38.02
2003/0002551 A1 * 1/2003 Kwon et al. .............. 372/38.02
2003/0086455 A1 * 5/2003 Ciubotaru et al. ........ 372/38.02

* cited by examiner

Primary Examiner—Paul Ip
Assistant Examiner—James Menefee
(74) Attorney, Agent, or Firm—Birch, Stewart, Kolasch & Birch, LLP

(57) ABSTRACT

A driving control circuit for a light-emitting device. The circuit generates a high-speed modulated current to drive the light-emitting device. The circuit includes an adjustable gain circuit, a current output circuit, and a level control circuit. The adjustable gain circuit receives a digital signal and generates an output voltage controlled by a first control signal and a second control signal. The current output circuit includes a first transistor. A gate of the first transistor is coupled to the adjustable gain circuit, which adjusts a range of the gate voltage to generate the high-speed modulated current, and the level control circuit sets the voltages of the first control signal and the second control signal.

16 Claims, 8 Drawing Sheets

DRIVING CONTROL CIRCUIT FOR LIGHT-EMITTING DEVICE

BACKGROUND OF THE INVENTION

1. Field of the Invention

The present invention relates in general to a driving control circuit for a light-emitting device. In particular, the present invention relates to a circuit to control the range of a driving current of a light-emitting device.

2. Description of the Related Art

In the present driving circuit of the light-emitting device, the bias current and the modulated current are controlled separately. The modulated current is provided by a differential output stage. The bias current is provided by a circuit source.

FIG. 1 is a circuit diagram of a conventional driving control circuit for a light-emitting device. In FIG. 1, the conventional driving control circuit drives a laser diode LD100. This circuit includes a pair of input terminals 100 and 101, and a differential output circuit 102 to be applied with a digital data signal to drive the laser diode LD100, a current source circuit 105 for supplying a constant current $I_{101}$ as a driving current to the laser diode LD100 through the differential output circuit 102, and a current source circuit 106 for supplying a constant current $I_{102}$ as a dc bias current to the laser diode LD100.

The differential output circuit 102 is formed by n-channel MOS transistors Q101 and Q102 whose sources are coupled together, such as by a source-coupled pair of MOS transistors Q101 and Q102. The digital data signal is applied across the non-inverted input terminal 100 and the inverted input terminal 101. The terminal 100 is connected to a gate of the MOS transistor Q102. The terminal 101 is connected to a gate of the MOS transistor Q101. A drain of the transistor Q101 is connected to one end of a load resistor R101. The other end of the resistor R101 is applied with a power supply voltage $V_{DD}$. A drain of the transistor Q102, which serves as an output terminal of the conventional driving control circuit, is connected to the cathode of the laser diode LD100. The anode of the laser diode LD100 is applied with the power supply voltage $V_{DD}$.

The current source circuit 105 is formed by n-channel MOS transistors Q103 and Q104 serving as a current mirror, and a reference current source 103 for supplying a constant reference current $I_{ref1}$ to the transistor Q104. A drain of the transistor Q103 is connected to the coupled sources of the transistors Q101 and Q102. A source of the transistor Q103 is connected to the ground. A drain and a gate of the transistor Q104 are connected in common to a gate of the transistor Q103. A source of the transistor Q104 are connected to the ground. The commonly connected drain and gate of the transistor Q104 are connected to one end of the reference current source 103. The other end of the reference current source 103 is applied with the power supply voltage $V_{DD}$.

The current source circuit 106 is formed by n-channel MOS transistors Q105 and Q106 serving as a current mirror, and a reference current source 104 for supplying a constant reference current $I_{ref2}$ to the transistor Q106. A drain of the transistor Q105 is connected to the drain of the cathode of the laser diode LD100, i.e., the output terminal of the conventional driving control circuit of FIG. 1. A source of the transistor Q105 is connected to the ground. A drain and a gate of the transistor Q106 is connected in common to a gate of the transistor Q105. A source of the transistor Q106 is connected to the ground. The commonly connected drain and gate of the transistor Q106 are connected to one end of the reference current source 104. The other end of the reference current source 104 is applied with the power supply voltage $V_{DD}$.

The above-described conventional driving control circuit of FIG. 1 has the following problems:

The first problem is that the current consumption of the circuit of FIG. 1 is large, because the dc bias current $I_{102}$ is always consumed during operation irrespective of the existence and absence of light emission and because the driving current $I_{101}$.

Second, the work voltage in the output terminal is limited because two transmitters are series in the differential output stage. Therefore, the circuit of FIG. 1 does not work when the output work voltage is lower than $V_{DD}$. The efficiency of the current is reduced and the application of the circuit becomes more complex.

SUMMARY OF THE INVENTION

An object of the present invention is to provide a driving control circuit for a light-emitting device that has better efficiency and is able to increase the work voltage in the output terminal.

Another object of the present invention is to provide a driving control circuit for a light-emitting device that automatically adjusts a gate voltage of the output transistor according to a predetermined bias voltage, and a modulated current to control the gate voltage precisely, thereby enabling a decrease in the power consumption and an increase in the range of the work voltage in the output terminal.

The inventive circuit comprises an adjustable gain circuit, a current output circuit, and a level control circuit. The adjustable gain circuit receives a digital signal and generates an output voltage controlled by a first control signal and a second control signal. The current output circuit comprises a first transistor. A gate of the first transistor is coupled to the adjustable gain circuit. The adjustable gain circuit adjusts a range of the gate voltage to generate the high-speed modulated current. The level control circuit sets the voltages of the first control signal and the second control signal.

The level control circuit comprises a duplicate circuit, a first negative feedback current and a second negative feedback current. The duplicate circuit receives a high level signal and a low level signal and generates a first output current and a second output current. The first negative feedback current sets the first current equal to a first predetermined current and outputs a voltage to set a voltage of the first control signal. The second negative feedback current sets the second current equal to a second predetermined current and outputs a voltage to set a voltage of the second control signal. The high level signal raises the gate voltage of the first transistor above a high level voltage. The low level signal lowers the gate voltage of the first transistor below a low level voltage. The adjustable range of the gate voltage is between the high level voltage and the low level voltage.

Furthermore, the invention also provides another driving control circuit for a light-emitting device to generate a high-speed modulated current to drive the light-emitting device. The circuit comprises an adjustable gain circuit, a current output circuit and a level control circuit. The adjustable gain circuit receives a digital signal and generates an output voltage controlled by a first control signal and a second control signal. The current output circuit comprises a first transistor. A gate of the first transistor is coupled to the adjustable gain circuit. The adjustable gain circuit adjusts a range of the gate voltage to generate the high-speed modulated current. The level control circuit sets the voltages of the first control signal and the second control signal.

The level control circuit comprises a level detect circuit, a first negative feedback current and a second negative feedback current. The level detect circuit is coupled to the adjustable gain circuit and generates a first output current and a second output current. The first negative feedback current sets the first current equal to a first predetermined current and outputs a voltage to set a voltage of the first control signal. The second negative feedback current sets the second current equal to a second predetermined current and outputs a voltage to set a voltage of the second control signal. The adjustable range of the gate voltage is between a high level voltage and a low level voltage.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
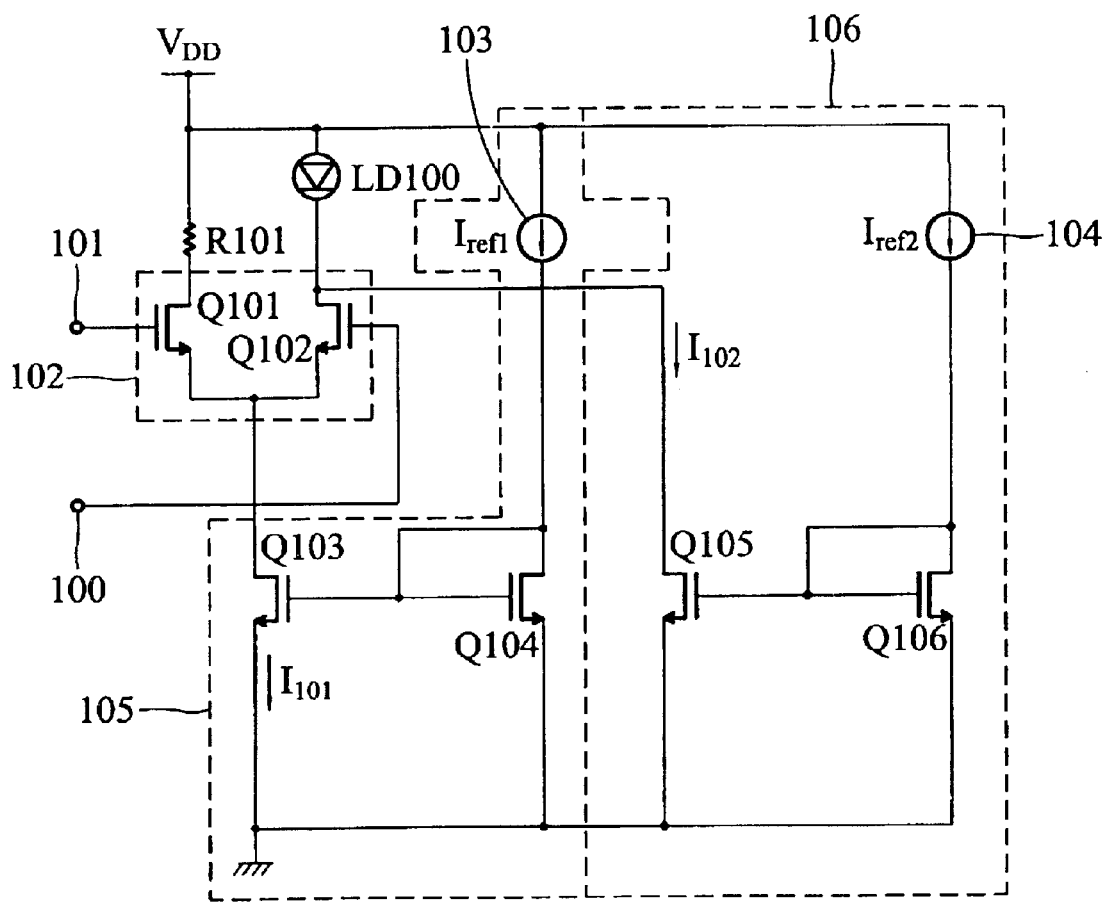
FIG. 1 is a circuit diagram of a conventional driving control circuit for a light-emitting device.
Figure 2A:
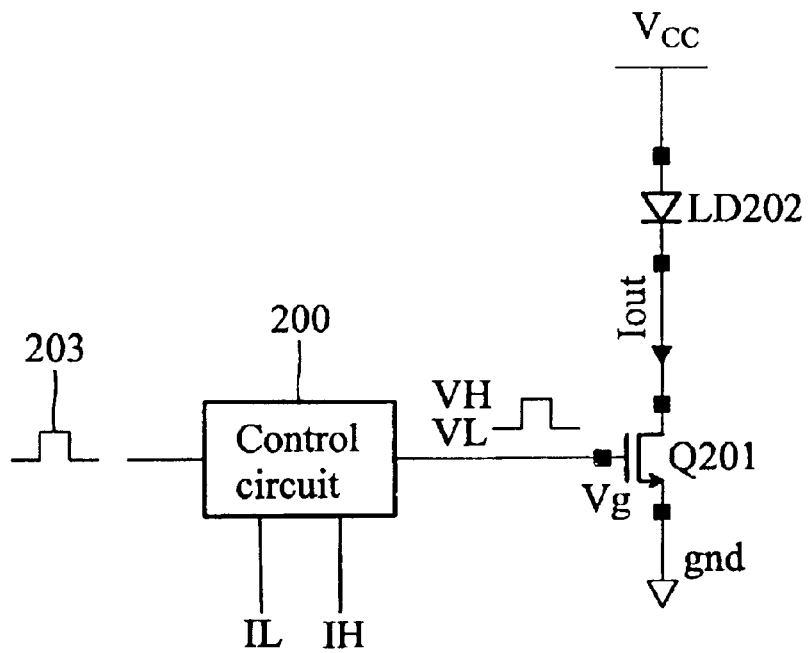
FIG. 2A is a schematic diagram of a driving control circuit for a light-emitting device according to the invention.

FIG. 2A is a schematic diagram of a driving control circuit for a light-emitting device according to the invention. A digital signal 203 is input to a control circuit 200. The output of the control circuit 200 is connected to a gate of an output transmitter Q201. A drain of the output transistor Q201, which serves as an output terminal of the conventional driver circuit, is connected to a cathode of a light-emitting device LD202. The anode of the light-emitting device LD202 is applied with a power supply voltage $V_{CC}$. The control circuit 200 controls the gate voltage Vg of the output transistor Q201 precisely. The control circuit 200 automatically adjusts the gate voltage Vg according to predetermined currents IL and IH to generate a high-speed modulated current Iout to drive the light-emitting device LD202, thereby enabling a decrease in the power consumption and an increase in the range of the work voltage in the output terminal. The predetermined current IL is a bias current of the light-emitting device LD202. The predetermined current IH is a sum current of the bias current and a high-speed modulated current of the light-emitting device LD202.

Figure 2B:
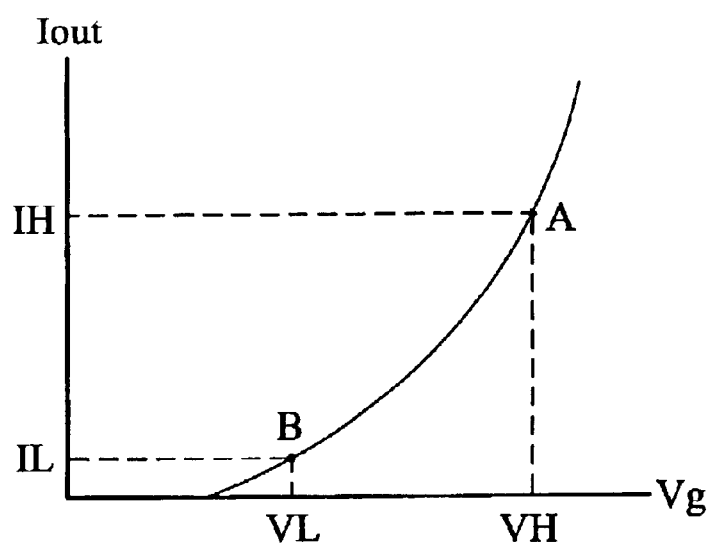
FIG. 2B is a graph showing the relation between a voltage of a gate of an output transmitter and two predetermine currents.

FIG. 2B is a graph showing the relation between a voltage of a gate of an output transmitter and two predetermine currents. The cross axis is the gate voltage Vg. The vertical axis is the high-speed modulated current Iout. The point A in the FIG. 2B is the predetermined current IH corresponding to the high level of the gate voltage VH. The point B in the FIG. 2B is the predetermined current IL corresponding to the low level of the gate voltage VL.

Figure 3A:
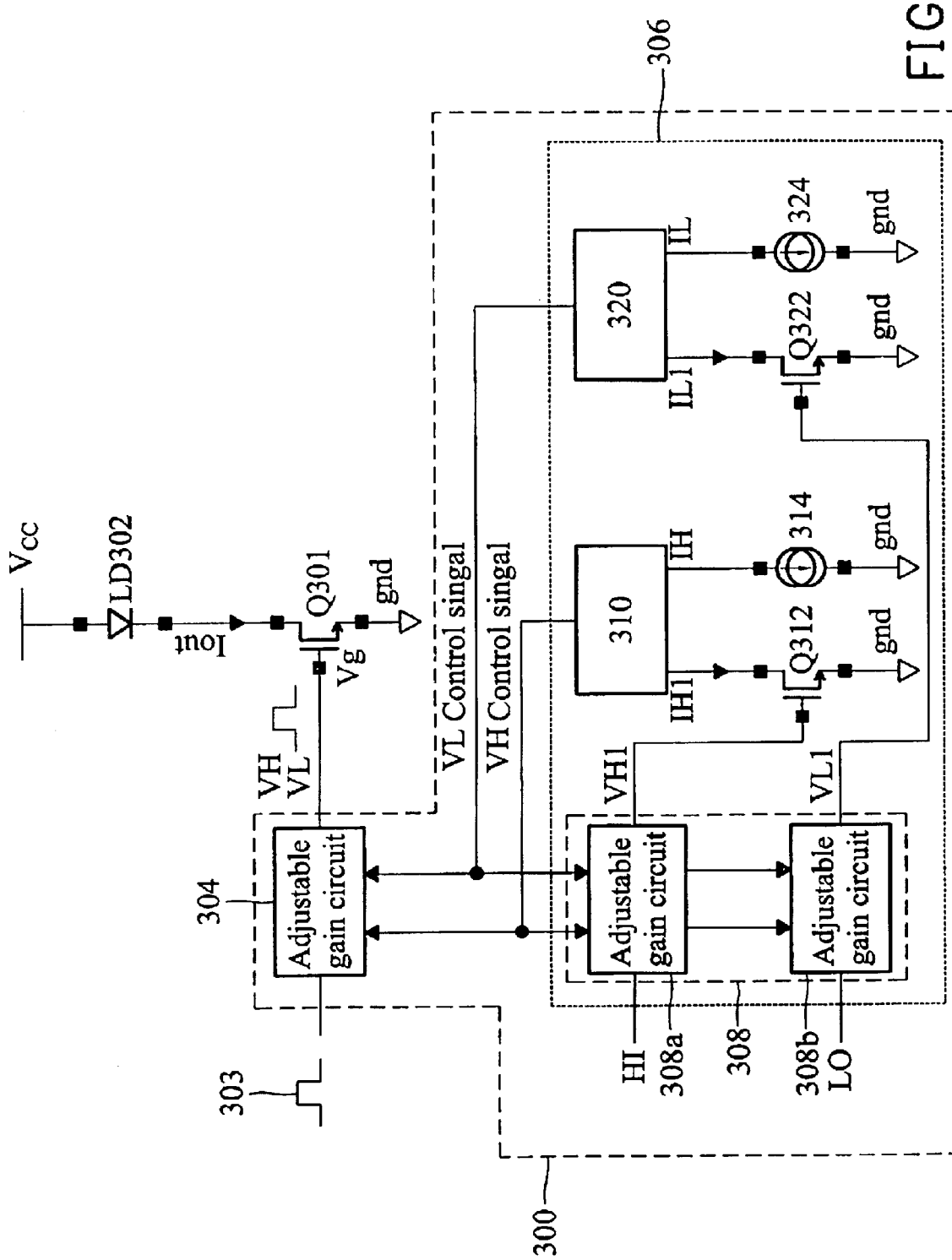
FIG. 3A is a schematic diagram of a driving control circuit for a light-emitting device according to a first embodiment of the invention.

FIG. 3A shows a schematic diagram of a driving control circuit for a light-emitting device according to a first embodiment of the invention. A digital signal 303 is input to a control circuit 300. The output of the control circuit 200 is connected to a gate of an output transmitter Q301. A drain of the output transistor Q301, which serves as an output terminal of the conventional driver circuit, is connected to a cathode of a light-emitting device LD302. The anode of the light-emitting device LD202 is applied with a power supply voltage $V_{CC}$.

The control circuit 300 comprises an adjustable gain circuit 304 and a level control circuit 306. The adjustable gain circuit 304 receives the digital signal 303 and generates an output voltage controlled by a VL control signal and a VH control signal. A high level signal HI and a low level signal LO of the digital signal are input to the level control circuit 306 to set the VL control signal and the VH control signal.

The level control circuit 306 comprises an adjustable circuit 308, a transistor Q312, two comparison circuits 310 and 320 and two current sources 314 and 324. The adjustable circuit 308 comprises two duplicate adjustable gain circuit 308a and 308b. Each structure of the duplicate adjustable gain circuits is the same as the adjustable gain circuit 304. Therefore, the duplicate adjustable gain circuits 308a and 308b can simulate the output of the adjustable gain circuit 304. The duplicate adjustable gain circuit 308a receives the high level signal HI and generates a high voltage VH1 to output. The duplicate adjustable gain circuit 308b receives the low level signal LO and generates a low voltage VL1 to output. The high voltage VH1 is input to a gate of a transistor Q312. A drain of the transistor Q312 outputs an output current IH1. The output current IH1 is input to the comparison circuit 310. The comparison circuit 310 makes the output current IH1 equal to a predetermined current IH provided the current source 314. The VH control signal is set by an output from the output terminal of the comparison circuit 310. The low voltage VL1 is input to a gate of a transistor Q322. A drain of the transistor Q322 outputs an output current IL1. The output current IL1 is input to the comparison circuit 320. The comparison circuit 320 makes the output current IL1 equal to a predetermined current IL provided by the current source 324. The VL control signal is set by an output from the output terminal of the comparison circuit 320.

The control circuit 300 controls the gate voltage Vg of the output transistor Q301 precisely. The control circuit 300 automatically adjusts the gate voltage Vg according to the predetermined currents IL provided by the current source 324 and the predetermined currents IH provided by the current source 314 to generate a high-speed modulated current Iout to drive the light-emitting device LD302, thereby enabling a decrease in the power consumption and an increase in the range of the work voltage in the output terminal. The predetermined current IL is a bias current of the light-emitting device LD302. The predetermined current IH is a sum current of the bias current and a high-speed modulated current of the light-emitting device LD302.

Figure 3B:
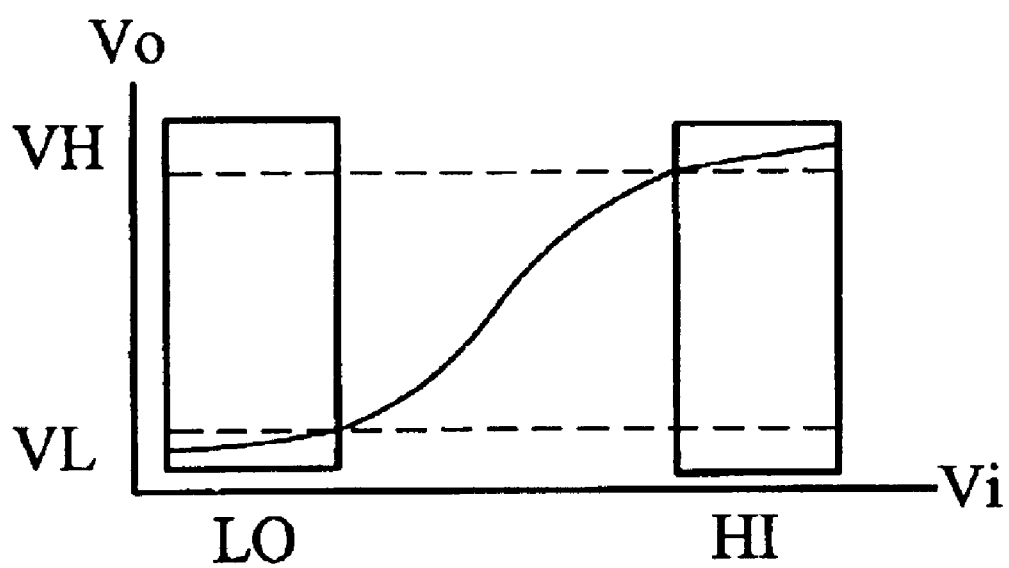
FIG. 3B is a graph showing the relation between input signals and output voltages of the adjustable gain circuit and the adjustable circuit of FIG. 3A.

FIG. 3B shows a graph showing the relation between input signals and output voltages of the adjustable gain circuit 304 and the adjustable circuit 308. The cross axis is the input voltage Vi of the adjustable gain circuit 304. The vertical axis is the output voltage Vo of the adjustable gain circuit 304. The high level signal HI raises the output voltage Vo above a high level voltage VH. The low level signal LO lowers the output voltage Vo below a low level voltage VL. The high level voltage VH approximates a high level of the gate voltage of the transmitter Q301. The low level voltage VL also approximates a low level of the gate voltage of the transmitter Q301.

Figure 4:
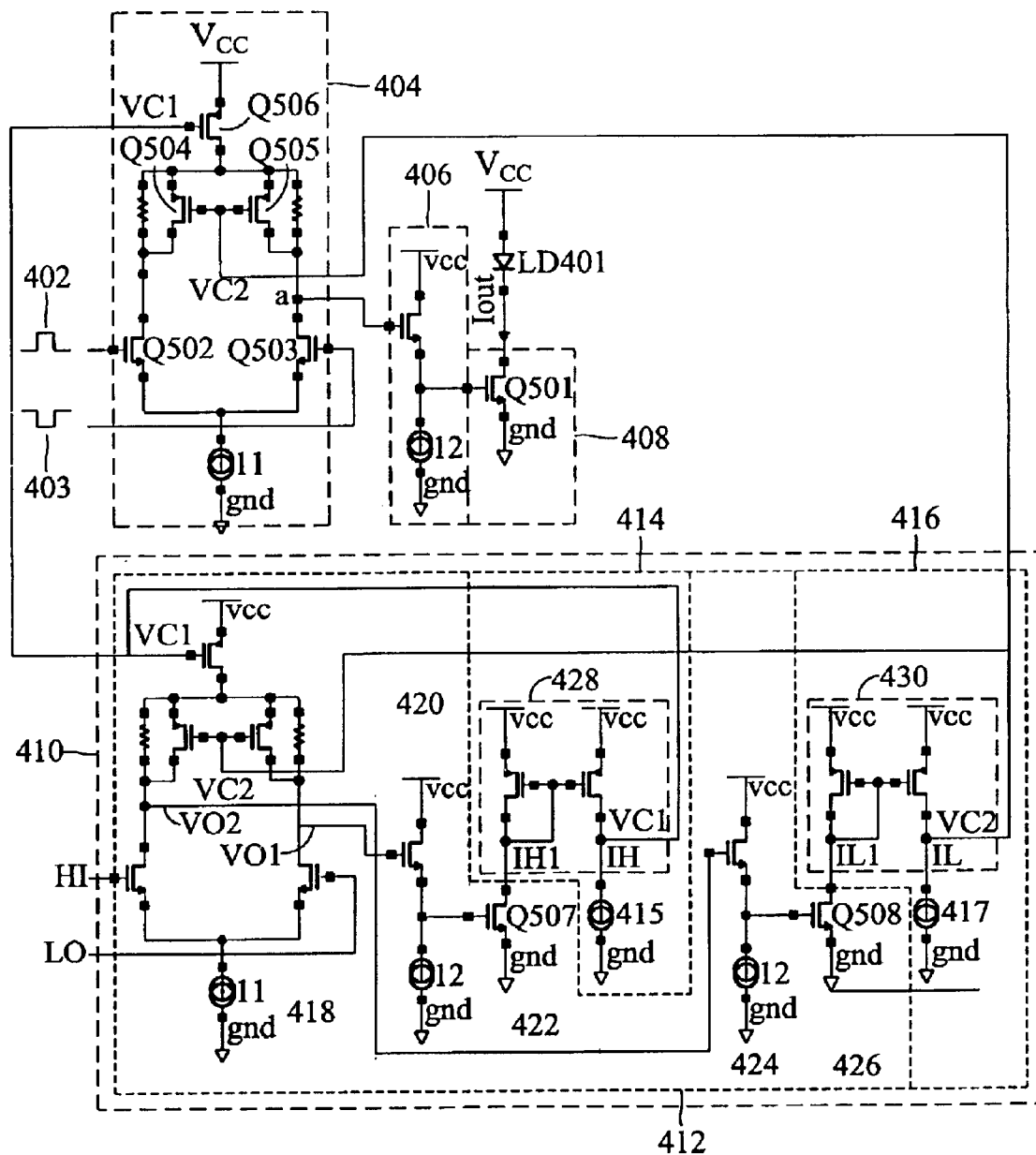
FIG. 4 is a circuit diagram of a driving control circuit for a light-emitting device according to the first embodiment of the invention.

FIG. 4 is a circuit diagram of a driving control circuit for a light-emitting device according to the first embodiment of the invention. As shown in FIG. 4, the driving control circuit for the light-emitting device generates a high-speed modulated current Iout to drive the light-emitting device LD401. The driving control circuit for the light-emitting device comprises an adjustable gain circuit 404, a level buffer circuit 406, a current output circuit 408 and a level control circuit 410. In the embodiment, a pair of differential signals is input to the adjustable gain circuit 404. The differential signals comprise a first digital signal 402 and a second digital signal 403. The second digital signal 402 is an inverse signal of the first digital signal 402. An output voltage of the adjustable gain circuit 404 is controlled by a VL control signal VC1 and a VH control signal VC2. The level buffer circuit 406 transforms the level of the output voltage from the adjustable gain circuit 404. The current output circuit 408 comprises a transistor Q501. A gate of the transistor Q501 is connected to the level buffer circuit 406, then to the adjustable gain circuit 404. The adjustable gain circuit 404 adjusts a range of the gate voltage of the transistor Q501 to generate the high-speed modulated current Iout. The level control circuit 410 sets the VL control signal VC1 and the VH control signal VC2.

The adjustable gain circuit 404 comprises transistors Q502~Q506. The first digital signal 402 is input to a gate of the transistor Q502. The second digital signal 403 is input to a gate of the transistor Q503. The VL control signal VC2 is input to a gate of the transistor Q504 and a gate of the transistor Q505. The VH control signal VC1 is input to a gate of the transistor Q506. A connection point of a drain of the transistor Q503 and a drain of the transistor Q505 is an output terminal of the adjustable gain circuit 404.

The level control circuit comprises a duplicate circuit 412, a first negative feedback current 414 and a second negative feedback current 416. A high level signal HI and a low level signal LO are input to the duplicate circuit 416. The duplicate circuit 416 generates an output current IH1 and an output current IL1. The first negative feedback current 414 sets the output current IH1 equal to a first predetermined current IH provided by a current source 415. The first negative feedback current 414 outputs a voltage to set the VH control signal VC1. The second negative feedback current 416 sets the output current IL1 equal to a first predetermined current IL provided by a current source 417. The second negative feedback current 416 outputs a voltage to set the VL control signal VC2. The high level signal HI is an input signal that makes the gate voltage of the transistor Q501 over than the range. The low level signal Lo is an input signal that makes the gate voltage of the transistor Q501 under than the range. In application, to simplify the circuit, the high level signal HI is a power supply voltage $V_{cc}$ and the low level signal LO is a ground voltage gnd.

The duplicate circuit 412 comprises an adjustable circuit 418, a first level buffer circuit 420, a first current output circuit 422, a second level buffer circuit 424 and a second current output circuit 426. The structure of the duplicate adjustable gain circuit 418 is the same as the adjustable gain circuit 404. The high level signal HI and the low level signal LO are input to the adjustable gain circuit 418. The adjustable gain circuit 418 generates output voltages VO1 and VO2. The structure of the first level buffer circuit 420 is the same as the level buffer circuit 406, but the first level buffer circuit 420 transforms the level of the output voltage VO1 from the adjustable circuit 418. The structure of the first current output circuit 422 is the same as the current output circuit 408. The first current output circuit 422 comprises a transistor Q507. A gate of the transistor Q507 is connected to the first level buffer circuit 420. The output current IH1 is output from a drain of the transistor Q507. The structure of the second level buffer circuit 424 is the same as the level buffer circuit 406, but the second level buffer circuit 424 transforms the level of the output voltage VO2 from the adjustable circuit 418. The structure of the second current output circuit 426 is the same as the current output circuit 408. The second current output circuit 426 comprises a transistor Q508. A gate of the transistor Q508 is connected to the second level buffer circuit 424. The output current IL1 is output from a drain of the transistor Q508.

The first negative feedback current 414 comprises a first comparison circuit 428 for comparing the output circuit IH1 and the predetermined current IH. The second negative feedback current 416 comprises a second comparison circuit 430 for comparing the output circuit IL1 and the predetermined current IL. The predetermined current IL is a bias current of the light-emitting device LD401. The predetermined current IH is a sum current of the bias current and a high-speed modulated current of the light-emitting device LD401.

Figure 5A:
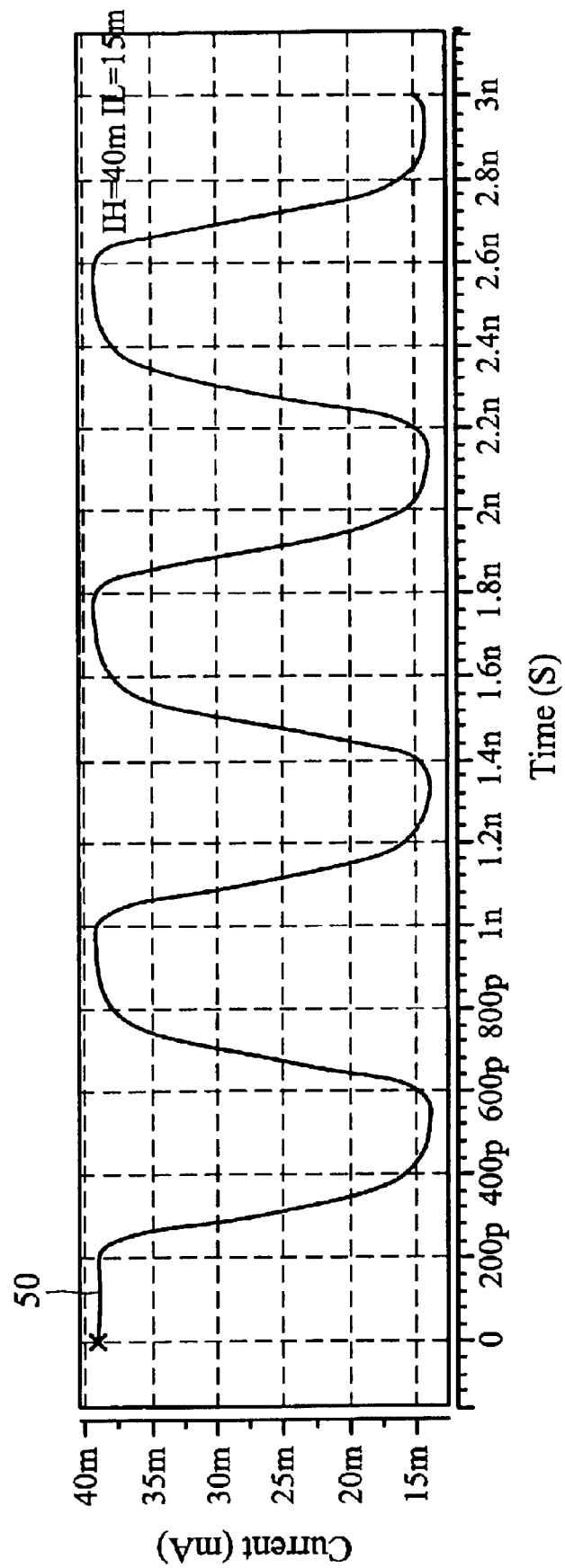
FIG. 5A and FIG. 5B are diagrams of output circuits which are produced by simulating different predetermined circuits according to the first embodiment of the invention.
Figure 5B:
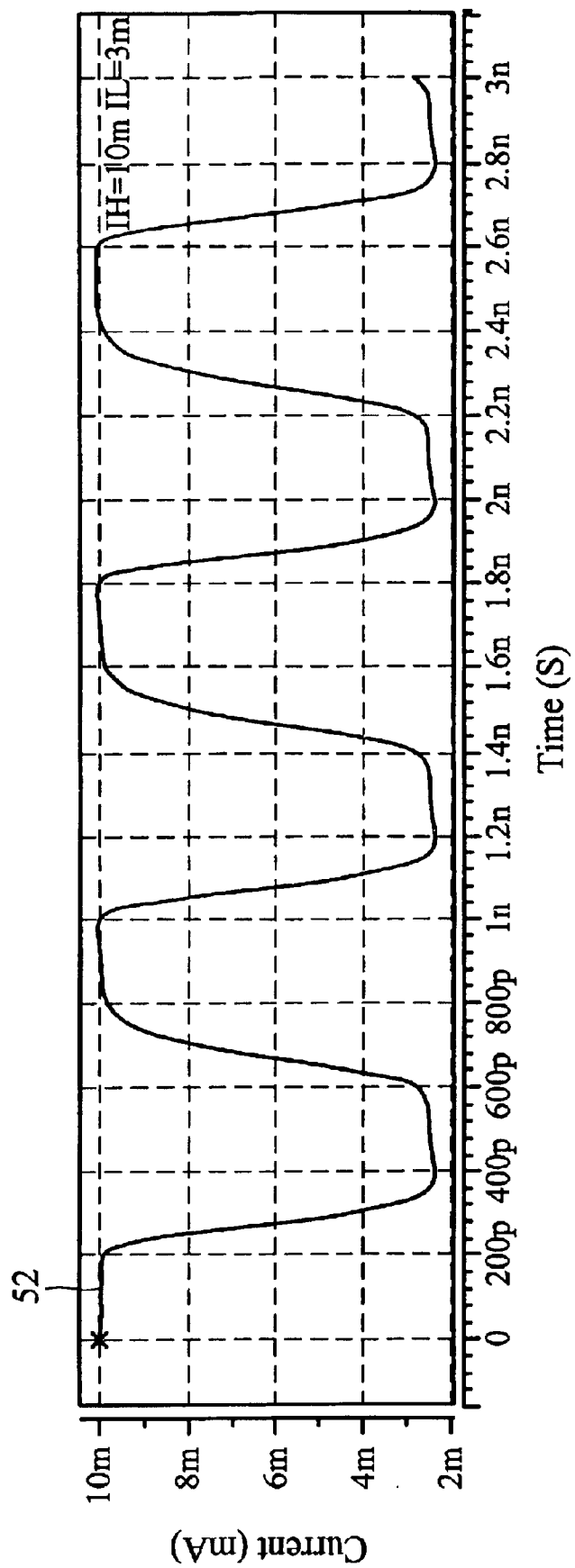

FIG. 5A and FIG. 5B are diagrams of output circuits produced by simulating different predetermined circuits according to the first embodiment of the invention. The cross axis is time. The vertical axis is current. The unit of the current is mA. As shown in FIG. 5A, the signal waveform 52 is the output of the driving control circuit according to the first embodiment of the invention, i.e. the high-speed modulated current Iout of the light-emitting device, when the predetermined circuit IH=40 mA and IL=15 mA. As shown in FIG. 5B, the signal waveform 54 is the output of the driving control circuit according to the first embodiment of the invention, i.e. the high-speed modulated current Iout of the light-emitting device, when the predetermined circuit IH=10 mA and IL=3 mA.

Figure 6:
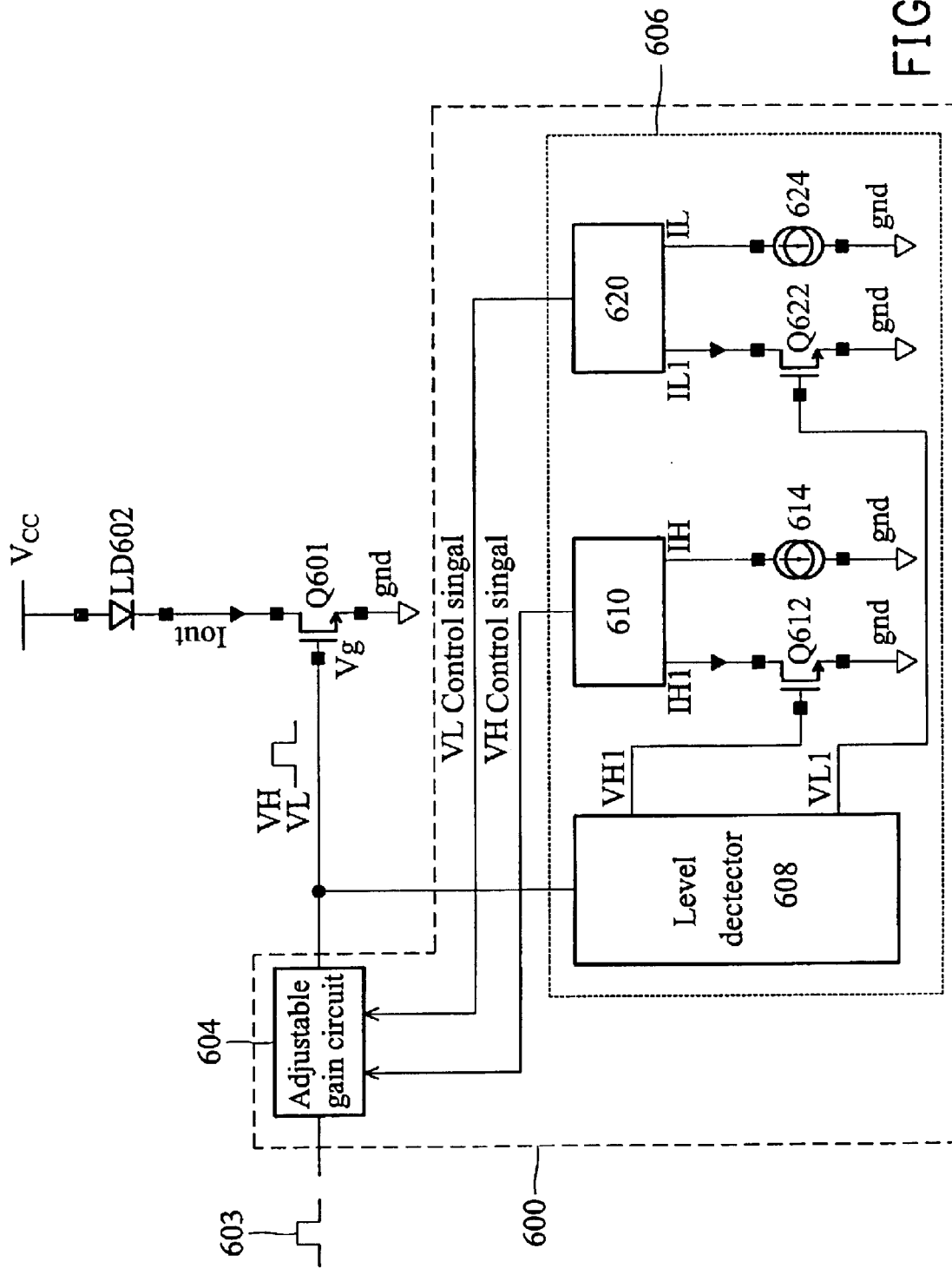
FIG. 6 is a schematic diagram of a driving control circuit for a light-emitting device according to a second embodiment of the invention.

FIG. 6 shows a schematic diagram of a driving control circuit for a light-emitting device according to a second embodiment of the invention. The first embodiment in FIG. 3A is basically the same as the second embodiment in FIG. 6, with the difference that the adjustable circuit 308 in the first embodiment is replaced by a level detector 608 in the second embodiment. Thus, instead of inputting the high level signal HI, the low level signal LO and the output voltage of the adjustable gain circuit into the adjustable circuit 308, it only requires input of the output voltage of the adjustable gain circuit to the level detector 608.

As shown in FIG. 6, a digital signal 603 is input to the control circuit 600. The output of the control circuit 600 is connected to a gate of an output transmitter Q601. A drain of the output transistor Q601, which serves as an output terminal of the conventional driver circuit, is connected to a cathode of a light-emitting device LD602. The anode of the light-emitting device LD202 is applied with a power supply voltage $V_{CC}$.

The control circuit 600 comprises an adjustable gain circuit 604 and a level control circuit 606. The adjustable gain circuit 604 receives the digital signal 603 and generates the output voltage controlled by a VL control signal and a VH control signal. A high level signal HI and a low level signal LO of the digital signal is input to the level control circuit 606 to set the VL control signal and the VH control signal.

The level control circuit 606 comprises the level detector 608, a transistor 6312, two comparison circuits 610 and 620 and two current sources 614 and 624. The output voltage of the adjustable gain circuit 604 is input to the level detector 608. After detecting levels of the output voltage, the level detector 608 generates a high voltage VH1 and a low voltage VL1 to output. The high voltage VH1 is input to a gate of a transistor Q612. A drain of the transistor Q612 outputs an output current IH1. The output current IH1 is input to the comparison circuit 610. The comparison circuit 610 makes the output current IH1 equal to a predetermined current IH provided the current source 614. The VH control signal is set by an output from the output terminal of the comparison circuit 610. The low voltage VL1 is input to a gate of a transistor Q622. A drain of the transistor Q622 outputs an output current IL1. The output current IL1 is input to the comparison circuit 620. The comparison circuit 620 makes the output current IL1 equal to a predetermined current IL provided by the current source 624. The VL control signal is set by an output from the output terminal of the comparison circuit 620.

The control circuit 600 controls the gate voltage Vg of the output transistor Q601 precisely. The control circuit 600 automatically adjusts the gate voltage Vg according to the predetermined currents IL provided by the current source 624 and the predetermined currents IH provided by the current source 614 to generate a high-speed modulated current Iout to drive the light-emitting device LD602, thereby enabling a decrease in the power consumption and an increase in the range of the work voltage in the output terminal. The predetermined current IL is a bias current of the light-emitting device LD602. The predetermined current IH is a sum current of the bias current and a high-speed modulated current of the light-emitting device LD602.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Thus, the scope of the appended claims should be accorded the broadest interpretation so as to encompass all such modifications and similar arrangements.

What is claimed is:

1. A driving control circuit for a light-emitting device to generate a high-speed modulated current to drive the light-emitting device, comprising:

an adjustable gain circuit for receiving a digital signal and generating an output voltage controlled by a first control signal and a second control signal;

a current output circuit comprising a first transistor, wherein a gate of the first transistor is coupled to the adjustable gain circuit, and the adjustable gain circuit adjusts a range of the gate voltage to generate the high-speed modulated current; and a level control circuit for setting a voltage of the first control signal and a voltage of the second control signal, the level control circuit comprising:

a duplicate circuit, including at least one duplicate adjustable gain circuit, for receiving a high level signal and a low level signal and generating a first output current and a second output current;

a first negative feedback circuit for setting the first output current equal to a first predetermined current and outputting a voltage to set a voltage of the first control signal; and a second negative feedback circuit for setting the second output current equal to a second predetermined current and outputting a voltage to set a voltage of the second control signal;

wherein the high level signal raises the gate voltage of the first transistor above a high level voltage; the low level signal lowers the gate voltage of the first transistor below a low level voltage; the adjustable range of the gate voltage is between the high level voltage and the low level voltage.

2. The circuit as claimed in claim 1, wherein the duplicate circuit comprises:

an adjustable circuit comprising first and second duplicate adjustable gain circuits, wherein each structure of the duplicate adjustable gain circuits is the same as the adjustable gain circuit; the first duplicate adjustable gain circuit receives the high level signal and generates a first output voltage; the second duplicate adjustable gain circuit receives the low level signal and generates a second output voltage;

a first current output circuit, a structure of which is the same as the current output circuit, comprising a second transistor and outputting the first output current from a source of the second transistor, wherein the first output voltage from the first duplicate adjustable gain circuit is input to a gate of the second transistor; and a second current output circuit, a structure of which is the same as the current output circuit, comprising a third transistor and outputting the second output current from a source of the third transistor, wherein the second output voltage from the second duplicate adjustable gain circuit is input to a gate of the third transistor.

3. The circuit as claimed in claim 2, wherein the duplicate circuit further comprises:

a first level buffer circuit coupled between the first duplicate adjustable circuit and the first current output circuit for transforming a level of the first output voltage from the first duplicate adjustable circuit; and a second level buffer circuit coupled between the second duplicate adjustable circuit and the second current output circuit for transforming a level of the second output voltage from the second duplicate adjustable circuit.

4. The circuit as claimed in claim 1, wherein the first negative feedback circuit comprises a first comparison circuit for comparing the first output current and the first predetermined current.

5. The circuit as claimed in claim 1, wherein the second negative feedback circuit comprises a second comparison circuit for comparing the second output current and the second predetermined current.

6. The circuit as claimed in claim 1, wherein the first predetermined current is a bias current of the light-emitting device.

7. The circuit as claimed in claim 1, wherein the first predetermined current is a sum current of a bias current of the light-emitting device and the high-speed modulated current of the light-emitting device.

8. The circuit as claimed in claim 1, further comprising:
a level buffer circuit coupled between the adjustable gain circuit and the current output circuit for transforming a level of the output voltage from the adjustable gain circuit.

9. A driving control circuit for a light-emitting device to generate a high-speed modulated current to drive the light-emitting device, comprising:
an adjustable gain circuit for receiving a digital signal and generating an output voltage controlled by a first control signal and a second control signal;
a current output circuit comprising a first transistor, wherein a gate of the first transistor is coupled to the adjustable gain circuit, and the adjustable gain circuit adjusts a range of the gate voltage to generate the high-speed modulated current; and
a level control circuit for setting a voltage of the first control signal and a voltage of the second control signal, the level control circuit comprising:
a level detect circuit coupled to the adjustable gain circuit and generating a first output current and a second output current;
a first negative feedback circuit for setting the first output current equal to a first predetermined current and outputting a voltage to set a voltage of the first control signal; and
a second negative feedback circuit for setting the second output current equal to a second predetermined current and outputting a voltage to set a voltage of the second control signal;
wherein the adjustable range of the gate voltage is between a high level voltage and a low level voltage.

10. The circuit as claimed in claim 9, wherein the level detect circuit comprises:
a level detector for receiving the output voltage from the adjustable gain circuit and generating the high level voltage and the low level voltage after detecting a level of the output voltage;
a first current output circuit, a structure of which is the same as the current output circuit, comprising a second transistor and outputting the first output current from a source of the second transistor, wherein the high level voltage from the level detector is input to a gate of the second transistor; and
a second current output circuit, a structure of which is the same as the current output circuit, comprising a third transistor and outputting the second output current from a source of the third transistor, wherein the low level voltage from the level detector is input to a gate of the third transistor.

11. The circuit as claimed in claim 10, wherein the level detect circuit further comprises:
a first level buffer circuit coupled between the level detector and the first current output circuit for transforming a level of the first output voltage from the adjustable gain circuit; and
a second level buffer circuit coupled between the level detector and the second current output circuit for transforming a level of the second output voltage from the adjustable gain circuit.

12. The circuit as claimed in claim 9, wherein the first negative feedback circuit comprises a first comparison circuit for comparing the first output current and the first predetermined current.

13. The circuit as claimed in claim 9, wherein the second negative feedback circuit comprises a second comparison circuit for comparing the second output current and the second predetermined current.

14. The circuit as claimed in claim 9, wherein the first predetermined current is a bias current of the light-emitting device.

15. The circuit as claimed in claim 9, wherein the first predetermined current is a sum current of a bias current of the light-emitting device and the high-speed modulated current of the light-emitting device.

16. The circuit as claimed in claim 9, further comprising:
a level buffer circuit coupled between the adjustable gain circuit and the current output circuit for transforming a level of the output voltage from the adjustable gain circuit.

* * * * *